(12) United States Patent
Chen

(10) Patent No.: US 6,918,773 B2
(45) Date of Patent: Jul. 19, 2005

(54) CARD CONNECTOR

(75) Inventor: Sheng-Guo Chen, Taipei (TW)

(73) Assignee: Arima Computer Corporation, Taipei (TW)

( * ) Notice: Subject to any disclaimer, the term of this patent is extended or adjusted under 35 U.S.C. 154(b) by 77 days.

(21) Appl. No.: 10/708,208

(22) Filed: Feb. 17, 2004

(65) Prior Publication Data

US 2005/0106901 A1 May 19, 2005

(30) Foreign Application Priority Data

Nov. 17, 2003 (TW) ........................................ 92132111 A

(51) Int. Cl.[7] .............................................. H01R 12/00
(52) U.S. Cl. ...................................................... 439/64
(58) Field of Search ........................... 439/64, 181, 607

(56) References Cited

U.S. PATENT DOCUMENTS 5,402,319 A * 3/1995 Shumaker et al. .......... 361/796
6,115,242 A * 9/2000 Lambrecht .................. 361/684

* cited by examiner

Primary Examiner—Phuong Dinh
(74) Attorney, Agent, or Firm—Jiang Chyun IP Office

(57) ABSTRACT

A card connector for mounting and positioning a card on a circuit board and electrically connecting the card with the circuit board is provided. The card connector comprises a guiding frame, a connector socket, an isolation film and a conductive film. The guiding frame is set over the circuit board for guiding and accommodating a card. The connector socket is set on the circuit board for electrically and structurally connecting with one end of the card. The isolation film is set on the circuit board between the guiding frame and the circuit board. The conductive film is set on the isolation film between the guiding frame and the circuit board and is electrically connected to a grounding washer on the circuit board. Based on the aforementioned card connector, electrostatic charges in the card can be transferred to the grounding circuit of the circuit board via the guiding frame and the conductive film.

5 Claims, 3 Drawing Sheets

CARD CONNECTOR

BACKGROUND OF INVENTION

1. Field of the Invention

The present invention relates to a connector. More particularly, the present invention relates to a card connector.

2. Description of the Related Art

With rapid progress in the electronic technologies, many types of electronic products are widely used in our office and house in our day to day activities. In particular, the use of personal computer in our home has the greatest impact. At present, personal computers can be roughly classified into desktop computers and portable computers. The portable computers are further divided into notebook computer, pocket computer and tablet computer.

To reduce the size and weight of a portable computer such as a notebook computer, most computer peripheral devices are connected to a notebook computer externally on a need to use basis. Hence, many notebook computers are equipped with a number of connection interfaces for engaging with different peripheral devices. The most common types of connection interfaces found in a notebook computer include PC card, USB and IEEE 1394, where PC card is a later version of the personal computer memory card international association (PCMCIA). According to the function, PC card can be categorized into network card, data card, sound card, memory card and so on. Thus, a notebook computer is often equipped with a card connector with the PC card specification so that a PC card of whatever function can be inserted to communicate with the notebook computer.

It is to be noted that a human body is often a storage area for varying amount of electrical charges due to friction. When a user inserts a PC card into or remove a PC card from the card connector of a notebook computer, some electrostatic charges will be transferred to the card connector via the fingers and the metallic casing of the card. As the amount of electrostatic charges in the card connector reaches a threshold, an electrostatic discharge (ESD) between the card connector and the circuit board will occur. As a result, signal transmission between the notebook computer and the PC card will be unstable. To prevent such electrostatic discharge, the metallic guiding frame of the card connector is electrically connected to a ground terminal of the circuit board.

Conventionally, the guiding frame of the card connector uses a pair of grounding washers on each side of the frame to contact the grounding pads on the circuit board and a pair of metallic screws to tighten the grounding washer to the circuit board. In other words, the metallic guiding frame of the card connector is electrically connected to the grounding terminal of the circuit board. However, if there is a rapid accumulation of electrostatic charges in the guiding frame, this type of grounding may not act fast enough to conduct all the electrostatic charges away and prevent an undesirable electrostatic discharge.

SUMMARY OF INVENTION

Accordingly, at least one objective of the present invention is to provide a card connector set inside an electronic device for positioning a card and electrically connecting the card to the electronic device such that the possibility of an electronic device passing an electrostatic discharge test can be increased.

To achieve these and other advantages and in accordance with the purpose of the invention, as embodied and broadly described herein, the invention provides a card connector suitable for mounting on a circuit board for positioning a card and electrically connecting the card to the circuit board. The card connector comprises a guiding frame, a connector socket, an isolation film and a conductive film. The guiding frame is set on a first surface of the circuit board for guiding and accommodating a card. The connector socket is set on the first surface of the circuit board for electrically and mechanically connecting with one end of the card. The isolation film is set on the first surface of the circuit board between the guiding frame and the circuit board. The conductive film is set on the isolation film between the guiding frame and the circuit board. The conductive film also directly contacts the guiding frame and connects electrically with a grounding pad on the circuit board.

According to one embodiment of present invention, the guiding frame further comprises at least a grounding washer and at least a conductive screw. The grounding washer is formed as an integral unit with the guiding frame. Using the conductive screw, the grounding washer is tightened to the circuit board in contact with the grounding pad on the circuit board.

According to one embodiment of present invention, the grounding pad on the circuit board is set on a second surface of the circuit board. Hence, the conductive film can extend from the first surface to the second surface of the circuit board in order to connect with the grounding pad.

In this invention, an additional conductive film is formed over the isolation film between the guiding frame and the circuit board so that excess electrostatic charges accumulated on the card or the guiding frame can be channeled away to the ground terminal of the circuit board via the conductive film. With a larger ground contact area between the conductive film and the grounding pad of the circuit board, electrostatic charges in the card can be rapidly transferred to the grounding circuit of the electronic device (the circuit board) via the guiding frame and the conductive film. In other words, the probability of having an electrostatic discharge between the guiding frame of the card connector and the circuit board will be substantially reduced and hence the percentage of electronic devices with card connector passing an electrostatic discharge test can be substantially increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
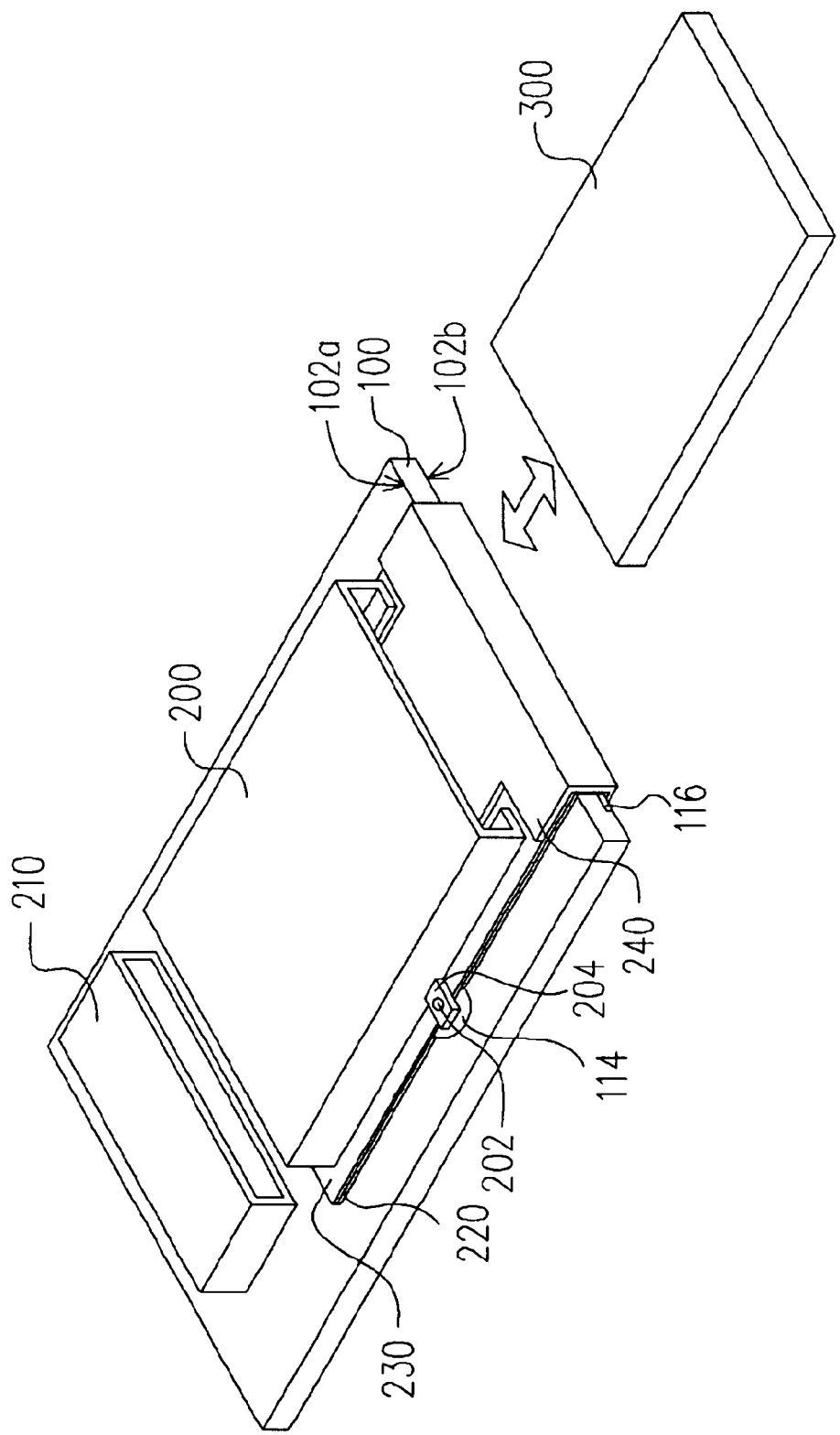
FIG. 1 is a perspective view of a card connector according to one preferred embodiment of present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
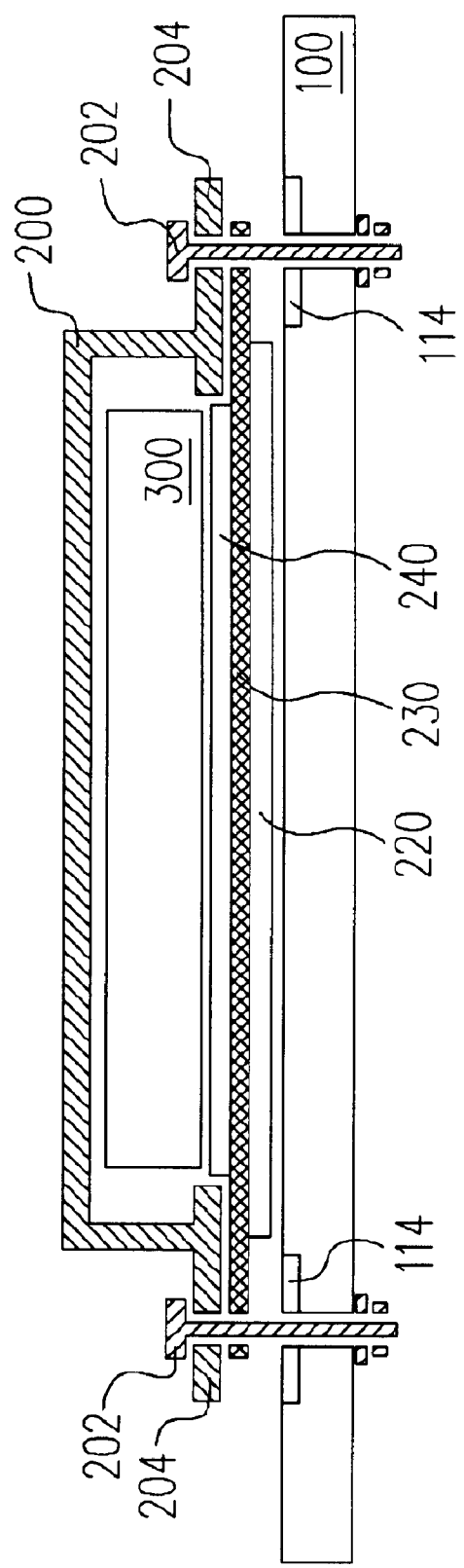
FIG. 2 is a cross-sectional view of a card connector according to one preferred embodiment of present invention.

FIG. 1 is a perspective view of a card connector according to one preferred embodiment of present invention. FIG. 2 is a cross-sectional view of a card connector according to one preferred embodiment of present invention. In FIG. 2, the connector socket 210 in FIG. 1 is not shown. As shown in FIGS. 1 and 2, the card connector of present invention comprises a guiding frame 200, a connector socket 210, a first isolation film 220 and a conductive film 230. The guiding frame 200 is set on a first surface 102a of the circuit board 100 for guiding and accommodating a card 300. The guiding frame 200 is fabricated using a conductive material such as a metal. Furthermore, each side of the guiding frame 200 has a grounding washer 204. The grounding washer 204 can be integrally formed with the guiding frame 200. By using the grounding washers 204 and the conductive screws 202, the guiding frame 200 is fastened to the circuit board 100. In addition, the grounding washers 204 also contact the grounding pads 114 on the circuit board 100, so that electrostatic charges on the guiding frame 200 can be discharged from the grounding washers 204 to the grounding terminal of the circuit board 100. Hence, aside from protecting the card 300, electrostatic charges can be transferred from the card 300 to the grounding terminal of the circuit board 100 via the two grounding washers 204 when the card 300 is in contact with the guiding frame 200 of the card connector. The connector socket 210 is set on the first surface 102a of the circuit board 100 such that the connector socket 210 is electrically and structurally connected to one end of the card 300. Therefore, the connector socket 210 also serves as a single transmission media between the card 300 and the circuit board 100.

Figure 3:
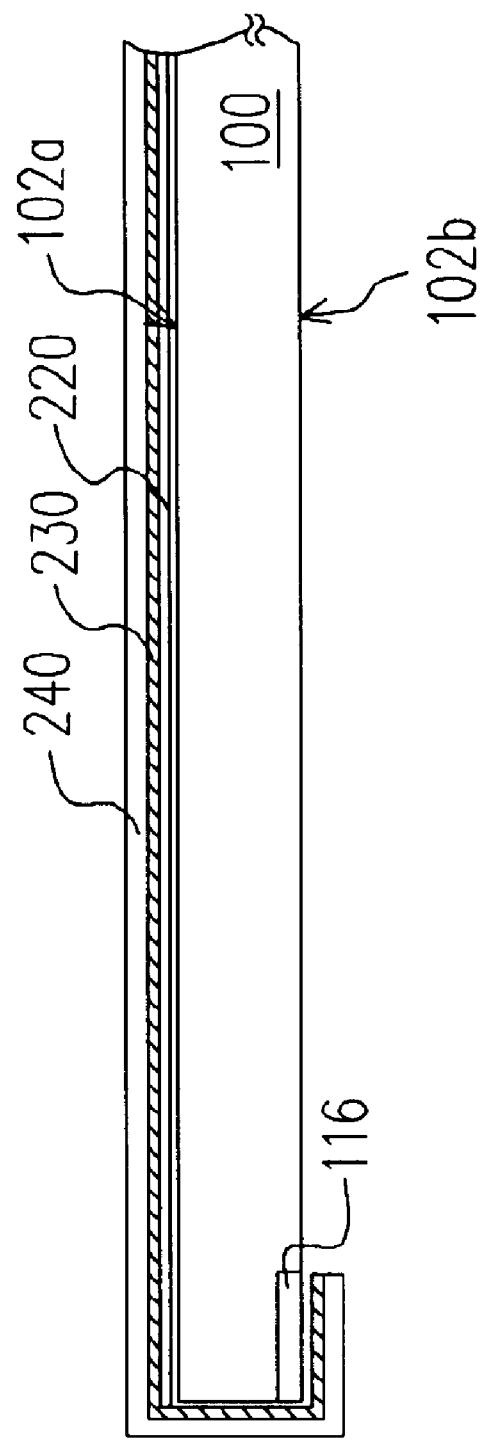
FIG. 3 is a cross-sectional view showing a pair of isolation films and a conductive film set on the circuit board of a card connector according to one preferred embodiment of present invention.

FIG. 3 is a cross-sectional view showing a pair of isolation films and a conductive film set up on the circuit board of a card connector according to one preferred embodiment of present invention. As shown in FIGS. 1, 2 and 3, the first isolation film 220 is set on the first surface 102a of the circuit board 100 between the guiding frame 200 and the circuit board 100. The first isolation film 220 is a polyester film, for example. Aside from protecting the surface of the circuit board, the first isolation film 220 also prevents unwanted objects from contacting the exposed circuit lines on the circuit board 100 and causing circuit board 100 malfunction. It should be noted that the conductive film 230 is set on the first isolation film 220 between the guiding frame 200 and the circuit board 100 and the conductive film 230 is in contact with the surface of the guiding frame 200. Furthermore, the conductive film 230 may extend to the second surface 102b of the circuit board 100 and connect with the grounding pad 116 on the second surface 102b so that the conductive film 230 is electrically connected to the grounding terminal of the circuit board 100. Hence, any electrostatic charges accumulated in the guiding frame 200 can discharge to the grounding pad 116 of the circuit board 100 via the conductive film 230. The conductive film 230 can be fabricated using a metallic material such as aluminum. The card connector of present invention may further comprise a second isolation film 240 set on the conductive film 230 beside the contact area between the conductive film 230 and the guiding frame 200. The second isolation film 240 can be fabricated using a polyester film, for example. Aside from maintaining the appearance of the product, the second isolation film 240 may serve as a protective coating for the conductive film 230.

In summary, major advantages of the card connector according to present invention include: 1. The card connector of present invention has an additional conductive film over the original isolation film for increasing the ground contacting area of the card connector. Through the conductive film, excess electrostatic charges on the card or the guiding frame are quickly discharged to the grounding terminal of the circuit board. 2. The card connector of present invention further has another isolation film set over the conductive film for protecting the conductive film and maintaining a uniform appearance. 3. By adding a conductive film over the isolation film and extending the conductive film to the grounding pad of the circuit board, the resistance of the electrostatic discharge of the card connector is improved. 4. Aside from a card having a PC card (PCMCIA) specification, the card connector of present invention can be applied to accommodate various other types of cards with different interface specifications such as a compact flash (CF) card.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A card connector mounted on a circuit board for positioning a card on the circuit board and electrically connecting the card to the circuit board, comprising:

a guiding frame, set on a first surface of the circuit board for guiding and accommodating a card;

a connector socket, set on the first surface of the circuit board for electrically and structurally connecting with one end of the card connector;

a first isolation film, set on the first surface of the circuit board between the guiding frame and the circuit board; and a conductive film, set on the first isolation film between the guiding frame and the circuit board such that the conductive film contacts the guiding frame directly and connects with a grounding pad on the circuit board.

2. The card connector of claim 1, wherein the guiding frame further comprises at least a grounding washer and at least a conductive screw such that the grounding washer is integrally formed with the guiding frame and the grounding washer in contact with the grounding pad on the circuit board is tightened to the circuit board through the conductive screw.

3. The card connector of claim 1, wherein the grounding pad on the circuit board is located on a second surface opposite to the first surface so that the conductive film extends from the first surface of the circuit board to the second surface of the circuit board and connects with the grounding pad.

4. The card connector of claim 1, wherein material constituting the conductive film comprises aluminum.

5. The card connector of claim 1, wherein the connector further comprises a second isolation film set on the conductive film.

* * * * *